(12) United States Patent
Shin

(10) Patent No.: US 8,283,971 B2
(45) Date of Patent: Oct. 9, 2012

(54) INTERNAL VOLTAGE GENERATION CIRCUIT AND SEMICONDUCTOR APPARATUS USING THE SAME

(75) Inventor: Yoon Jae Shin, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 12/983,148

(22) Filed: Dec. 31, 2010

(65) Prior Publication Data

US 2012/0081175 A1    Apr. 5, 2012

(30) Foreign Application Priority Data

Sep. 30, 2010    (KR) .................. 10-2010-0095646

(51) Int. Cl.
   *G05F 1/10*    (2006.01)
(52) U.S. Cl. ........................................ 327/536
(58) Field of Classification Search ........... 327/535, 327/536, 537, 541
   See application file for complete search history.

(56) References Cited

U.S. PATENT DOCUMENTS

| | | | |
|---|---|---|---|
| 5,941,990 A | 8/1999 | Hiiragizawa | |
| 7,057,866 B2 * | 6/2006 | Hsu et al. | 361/18 |
| 7,733,162 B2 * | 6/2010 | Kim et al. | 327/536 |
| 8,067,978 B2 * | 11/2011 | Jurasek | 327/536 |
| 8,106,702 B2 * | 1/2012 | Jurasek | 327/536 |
| 2003/0210090 A1 | 11/2003 | Kwak et al. | |

FOREIGN PATENT DOCUMENTS

| | | |
|---|---|---|
| JP | 2000164805 A | 6/2000 |
| JP | 2003-068073 | 3/2003 |
| JP | 2006-203960 | 8/2006 |
| JP | 2009268091 A | 11/2009 |
| KR | 10200000045395 A | 7/2000 |
| KR | 1020100078691 A | 7/2010 |

* cited by examiner

*Primary Examiner* — Jeffrey Zweizig
(74) *Attorney, Agent, or Firm* — William Park & Associates Ltd.

(57) ABSTRACT

An internal voltage generation circuit includes a voltage detection unit configured to generate a voltage detection signal that indicates whether a voltage level of an internal voltage is a first target voltage level or a second target voltage level higher than the first target voltage level, according to control of a normal operation signal. The internal voltage generation circuit also includes an operation control signal generation unit configured to selectively activate an operation control signal in response to the normal operation signal and the voltage detection signal, a periodic pulse signal generation unit configured to generate a periodic pulse signal in response to the operation control signal and the normal operation signal, and a charge pumping unit configured to generate an internal voltage by performing a charge pumping operation according to control of the periodic pulse signal.

21 Claims, 4 Drawing Sheets

INTERNAL VOLTAGE GENERATION CIRCUIT AND SEMICONDUCTOR APPARATUS USING THE SAME

CROSS-REFERENCES TO RELATED APPLICATION

The present application claims priority under 35 U.S.C. §119(a) to Korean application number 10-2010-0095646, filed on Sep. 30, 2010, in the Korean Intellectual Property Office, which is incorporated herein by reference in its entirety.

BACKGROUND

1. Technical Field

The present invention relates to a semiconductor apparatus, and more particularly, to a technology for generating an internal voltage.

2. Related Art

In general, a semiconductor apparatus includes an internal voltage generation circuit configured to generate an internal voltage by using a power supply voltage applied from outside, in order to reduce the power consumption and efficiently use power. When the power supply is not stabilized and the level of the power supply voltage rises, the level of the internal voltage generated by the internal voltage generation circuit rises in correspondence to the rising of the level of the power supply voltage. At this time, the internal voltage maintains a constant voltage level after the power supply voltage reaches a target voltage level. Furthermore, although the power supply voltage rises to the target voltage level or more, the internal voltage maintains the constant voltage level.

The internal voltage generation circuit can generate an internal voltage having a higher voltage level than a power supply voltage by performing a charge pumping operation or the like. Since a large amount of current is required for generating the boosted voltage having a higher voltage level than the power supply voltage, there is a demand for a technique for reducing the current consumption.

SUMMARY

An internal voltage generation circuit capable of reducing current consumption in a stand-by mode and stably generating an internal voltage in a normal is described herein.

A semiconductor apparatus which uses an internal voltage as a driving voltage after the internal voltage reaches a target level, in order to improve operation stability, is described herein.

A semiconductor apparatus which reduces current consumption in a stand-by mode is described herein.

In one embodiment of the present invention, an internal voltage generation circuit includes a voltage detection unit configured to generate a voltage detection signal that indicates whether a voltage level of an internal voltage is a first target voltage level or a second target voltage level higher than the first target voltage level, according to control of a normal operation signal.

The internal voltage generation circuit may also comprise an operation control signal generation unit configured to selectively activate an operation control signal in response to the normal operation signal and the voltage detection signal, a periodic pulse signal generation unit configured to generate a periodic pulse signal in response to the operation control signal and the normal operation signal, and a charge pumping unit configured to generate the internal voltage by performing a charge pumping operation according to control of the periodic pulse signal.

In another embodiment of the present invention, a semiconductor apparatus includes a voltage detection unit configured to generate a voltage detection signal that indicates whether a voltage level of an internal voltage is a first target voltage level or a second target voltage level higher than the first target voltage level, according to control of a normal operation signal.

The semiconductor apparatus may also comprise an operation control signal generation unit configured to selectively activate an operation control signal in response to the normal operation signal and the voltage detection signal, a periodic pulse signal generation unit configured to generate a periodic pulse signal in response to the operation control signal and the normal operation signal, a charge pumping unit configured to generate the internal voltage by performing a charge pumping operation according to control of the periodic pulse signal, and an internal logic unit configured to perform an internal operation by using the internal voltage transferred through an internal voltage terminal as a driving voltage, in response to the operation control signal.

In another embodiment of the present invention, a semiconductor apparatus includes a voltage detection unit configured to detect a voltage level of an internal voltage and output the detection result as a voltage detection signal, and an operation control signal generation unit configured to selectively activate an operation control signal in response to a normal operation signal and the voltage detection signal.

The semiconductor apparatus may also comprise a periodic pulse signal generation unit configured to generate a periodic pulse signal in response to the operation control signal and the normal operation signal, a charge pumping unit configured to generate the internal voltage by performing a charge pumping operation according to control of the periodic pulse signal, and an internal logic unit configured to perform an internal operation by using the internal voltage transferred through an internal voltage terminal as a driving voltage, in response to the operation control signal.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus according to the present invention will be described below with reference to the accompanying drawings through exemplary embodiments.

For reference, since terms, symbols and signs that are used in drawings and in this detailed description to designate devices, blocks, and so on may be used for detailed units as the occasion demands, it is to be noted that the same terms, symbols and signs may not designate the same devices, blocks, and so on in an entire circuitry. In general, the logic signals of a circuit and binary data values are divided into a high level (H) and a low level (L) in correspondence to voltage levels and may be represented as '1' and '0'. Furthermore, as the occasion demands, a high impedance state (a high-Z state) may be defined and described.

An active high signal is said to be asserted when it is in the high level, and an active low signal is said to be asserted when it is in the low level. Additionally, when referring to signals, the terms "asserted" and "activated" may be used interchangeably. Similarly, the terms "deasserted" and "deactivated" may be used interchangeably.

Figure 1:
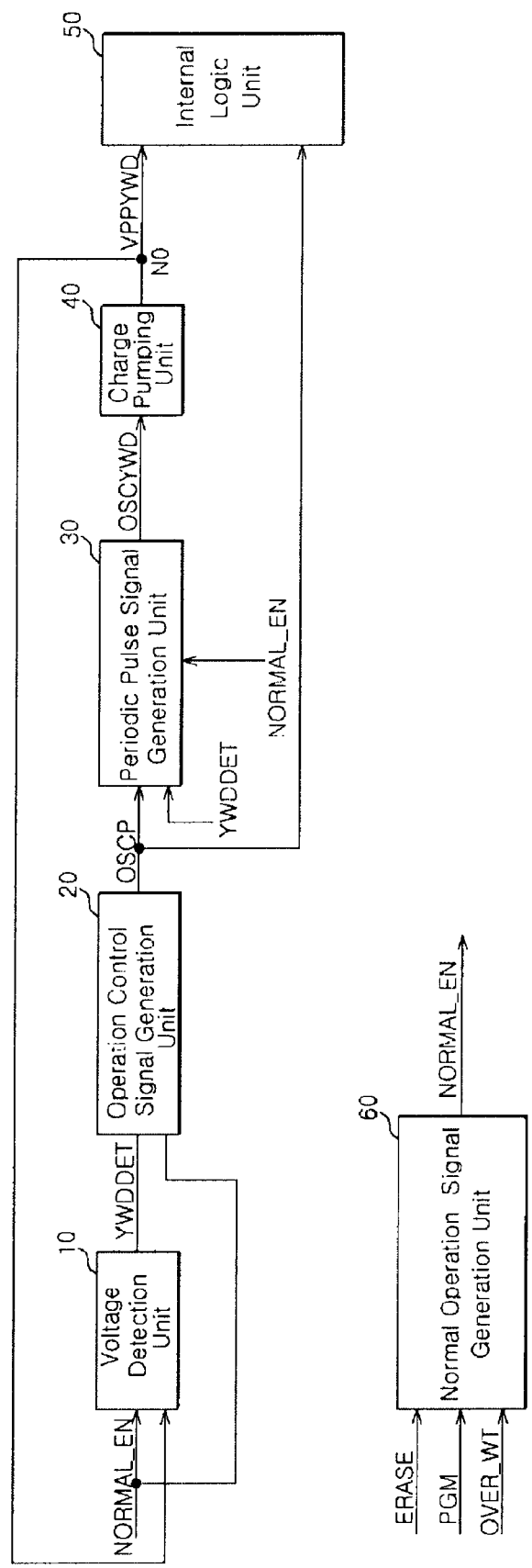
FIG. 1 is a configuration diagram of a semiconductor apparatus according to one embodiment of the invention.

FIG. 1 is a configuration diagram of a semiconductor apparatus according to one embodiment.

The semiconductor apparatus according to the embodiment includes only simple components for clearly explaining the technical spirit of the present invention.

Referring to FIG. 1, the semiconductor apparatus includes a voltage detection unit 10, an operation control signal generation unit 20, a periodic pulse signal generation unit 30, a charge pumping unit 40, an internal logic unit 50, and a normal operation signal generation unit 60. Here, the normal operation signal generation unit 60 may be selectively provided depending on embodiments.

The detailed configuration and operation of the semiconductor apparatus configured in such a manner will be described as follows.

The normal operation signal generation unit 60 is configured to generate a normal operation signal NORAML_EN when the semiconductor apparatus enters any one of a data programming mode, a data overwrite mode, and a data erasure mode. The normal operation signal NORMAL_EN is a signal which indicates a normal mode or stand-by mode. That is, when the normal operation signal NORMAL_EN is activated, it indicates the normal mode, and when the normal operation signal NORMAL_EN is deactivated, it indicates the stand-by mode. The normal operation signal generation unit 60 may include a logic unit configured to generate the normal operation signal NORMAL_EN by logically combining a data programming signal PGM, a data overwrite signal OVER_WR, and a data erasure signal ERASE. The logic unit may be configured as a circuit which performs an OR operation on the data programming signal PGM, the data overwrite signal OVER_WR, and the data erasure signal ERASE.

The voltage detection unit 10 is configured to detect the voltage level of an internal voltage terminal N0 and output the detection result as a voltage detection signal YWDDET. In this embodiment, when the normal operation signal NORMAL_EN is deactivated, the voltage detection unit 10 detects whether or not the voltage level of the internal voltage terminal V0 reaches a first target voltage level, and output the detection result as the voltage detection signal YWDDET. When the normal operation signal NORMAL_EN is activated, the voltage detection unit 10 detects whether or not the voltage level of the internal voltage terminal N0 reaches a second target voltage level higher than the first target voltage level, and outputs the detection result as a voltage detection signal. In other words, the voltage detection unit 10 detects whether or not the voltage level of the internal voltage terminal N0 reaches the first target voltage level in the stand-by mode, and detects whether or not the voltage level of the internal voltage terminal N0 reaches the second target voltage level in the normal mode. In this embodiment, the first target voltage level refers to a stand-by voltage level of an internal voltage VPPYWD, and the second target voltage level refers to a final target voltage level of the internal voltage VPPYWD.

The operation control signal generation unit 20 is configured to selectively activate an operation control signal OSCP in response to the normal operation signal NORMAL_EN and the voltage detection signal YWDDET. When the normal operation signal NORMAL_EN is activated, the operation control signal generation unit 20 outputs the voltage detection signal YWDDET as the operation control signal OSCP.

The periodic pulse signal generation unit 30 is configured to generate a periodic pulse signal OSCYWD which toggles in response to the operation control signal OSCP when the normal operation signal NORMAL_EN is activated, and generate a periodic pulse signal OSCYWD which toggles in response to the voltage detection signal YWDDET when the normal operation signal NORMAL_EN is deactivated. At this time, the periodic pulse signal generation unit 30 generates a periodic pulse signal OSCYWD having a shorter toggling period when the normal operation signal NORMAL_EN is activated than when the normal operation signal NORMAL_EN is deactivated.

The charge pumping unit 40 is configured to generate an internal voltage VPPYWD by performing a charge pumping operation according to the control of the periodic pulse signal OSCYWD, and output the generated internal voltage VPPYWD to the internal voltage terminal N0. The shorter the toggling period of the periodic pulse signal OSCYWD is, the more quickly the charge pumping unit 40 performs the charge pumping operation. Therefore, the voltage level of the internal voltage terminal N0 rises at a high speed. That is, since the periodic pulse signal OSCYWD has a shorter toggling period in the normal mode than in the stand-by mode, the rising speed of the voltage level of the internal voltage terminal N0 in the normal mode is higher than in the stand-by mode.

The internal logic unit 50 is configured to perform an internal operation by using the internal voltage VPPYWD transferred through the internal voltage terminal N0 as a driving voltage, in response to the operation control signal OSCP. The internal logic unit 50 performs the internal operation by using the internal voltage VPPYWD as a driving voltage from a time point at which the operation control signal OSCP is deactivated in the normal mode.

The time point at which the operation control signal OSCP is deactivated in the normal mode means a time point at which the voltage level of the internal voltage terminal N0 reaches the second target voltage level. Therefore, since the internal logic unit 50 begins the internal operation after the driving voltage is stabilized, it is possible to secure operation stability. At this time, the internal logic unit 50 may be defined as a logic unit using a high voltage as the driving voltage. Representative examples of the logic unit may include a data write unit which drives a programming current pulse by using the internal voltage VPPYWD as a driving voltage and a data read unit which drives a data read current by using the internal voltage VPPYWD as a driving voltage.

Such internal logic units perform an internal operation according to the control of the operation control signal OSCP informing that the internal voltage, that is, their driving voltage has reached a stable level. Therefore, the operation stability is improved. Furthermore, since a voltage formed at the internal voltage terminal N0 in the stand-by mode is lower than in the normal mode, it is possible to reduce unnecessary current consumption. Furthermore, when the mode is switched from the stand-by mode to the normal mode, the voltage level of the internal voltage terminal N0 quickly rises to the final target level. Therefore, it is possible to secure a quick operation characteristic of the internal logic unit using the internal voltage VPPYWD of the internal voltage terminal N0 as a driving voltage.

Figure 2:
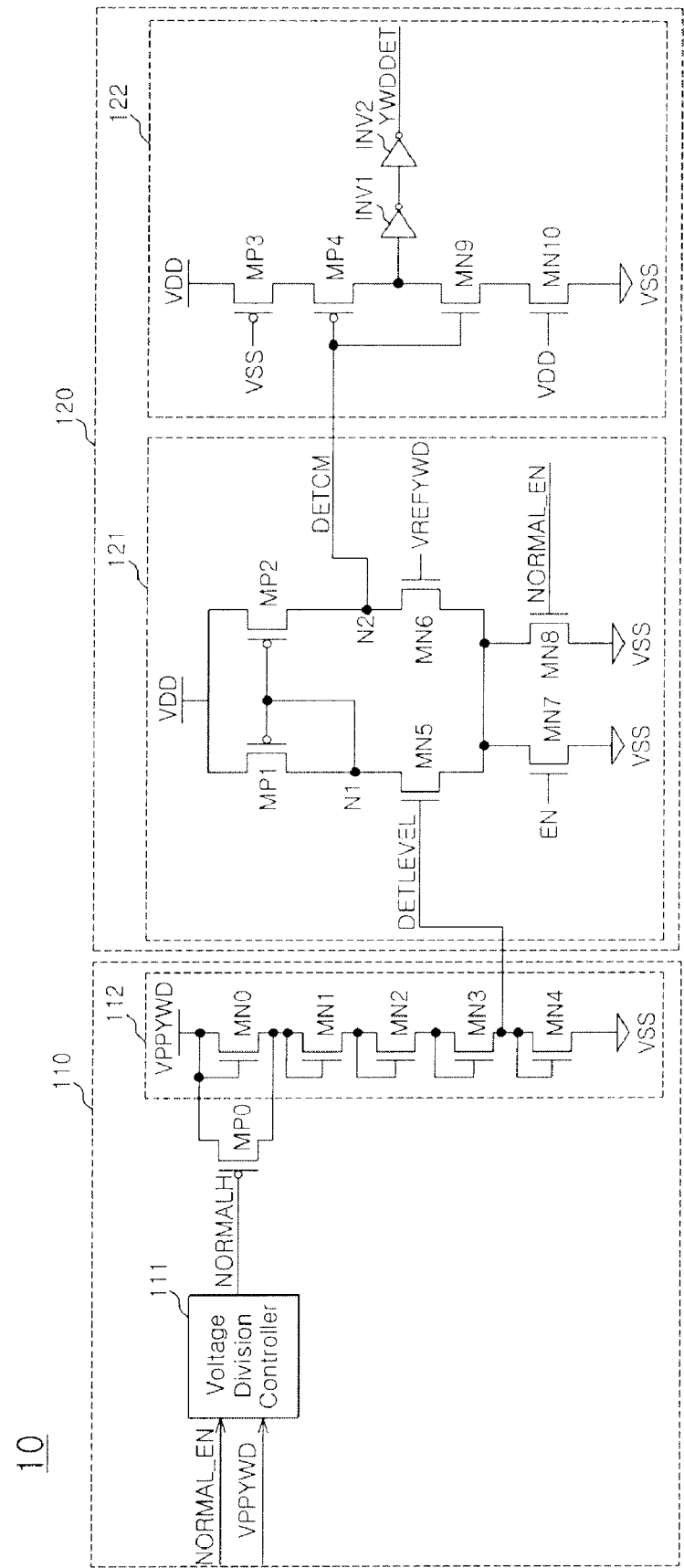
FIG. 2 is a circuit diagram of a voltage detection unit of FIG. 1.

FIG. 2 is a circuit diagram of the voltage detection unit 10 of FIG. 1.

Referring to FIG. 2, the voltage detection unit 10 includes a voltage division section 110 and a voltage comparison section 120.

The voltage division section 110 is configured to divide the voltage level of the internal voltage VPPYWD and output a divided voltage DETLEVEL. At this time, the voltage division section 110 adjusts a voltage division ratio according to the control of the normal operation signal NORMAL_EN and outputs the divided voltage DETLEVEL. In this embodiment, the voltage division section 110 includes a voltage division controller 111, a plurality of voltage drop elements 112, and a division switch MP0. The voltage division controller 111 is configured to output a division control signal NORMALH according to the control of the normal operation signal NORMAL_EN and the internal voltage VPPYWD, and may include a level shifter and so on. The plurality of voltage drop elements 112 include a plurality of MOS diodes MN0 to MN4 coupled in series between the internal voltage terminal VPPYWD and a ground voltage terminal VSS, and the divided voltage DETLEVEL is formed at a coupling node between the fourth and fifth diodes MN3 and MN4. When the division switch MP0 controlled by the division control signal NORMALH is turned on or off, the first MOS diode MN0 among the plurality of MOS diodes MN0 to MN4 is bypassed or performs a voltage drop operation. Therefore, the voltage division ratio is adjusted. That is, in the stand-by mode, the division control signal NORMALH becomes a low level to turn on the division switch MP0, and thus the first MOS diode MN0 is bypassed. Accordingly, the voltage division ratio becomes 1:4. Furthermore, in the normal mode, the division control signal NORMALH becomes a high level to turn off the division switch MP0, and thus the first MOS diode MN0 performs a voltage drop operation. Accordingly, the voltage division ratio becomes 1:5.

The voltage comparison section 120 is configured to compare the divided voltage DETLEVEL with a reference voltage VREFYWD in response to a comparison enable signal EN and the normal operation signal NORMAL_EN and output the comparison result as a voltage detection signal YWDDET. When the divided voltage DETLEVEL has a lower level than the reference voltage VREFYWD, a high-level voltage detection signal YWDDET is outputted. Furthermore, when the divided voltage DETLEVEL has a higher level than the reference voltage VREFYWD, a low-level voltage detection signal YWDDET is outputted.

In this embodiment, the voltage comparison section 120 includes a differential amplification section 121 and a signal output section 122. The differential amplification section 121 includes current mirrors MP1 and MP2, differential input sections MN5 and MN6, a first bias section MN7, and a second bias section MN8. The first bias section MN7 controlled by the comparison enable signal EN is configured to supply a bias current in the stand-by mode and the normal mode. The second bias section MN8 controlled by the normal operation signal NORMAL_EN is configured to supply a bias current only in the normal mode. Therefore, since the first and second bias sections MN7 and MN8 simultaneously supply a bias current in the normal mode, the operation speed increases. The signal output section 122 is configured to invert a signal DETCM outputted from an output terminal N2 of the differential amplification section 121 and output the inverted signal as a voltage detection signal YWDDET.

Figure 3:
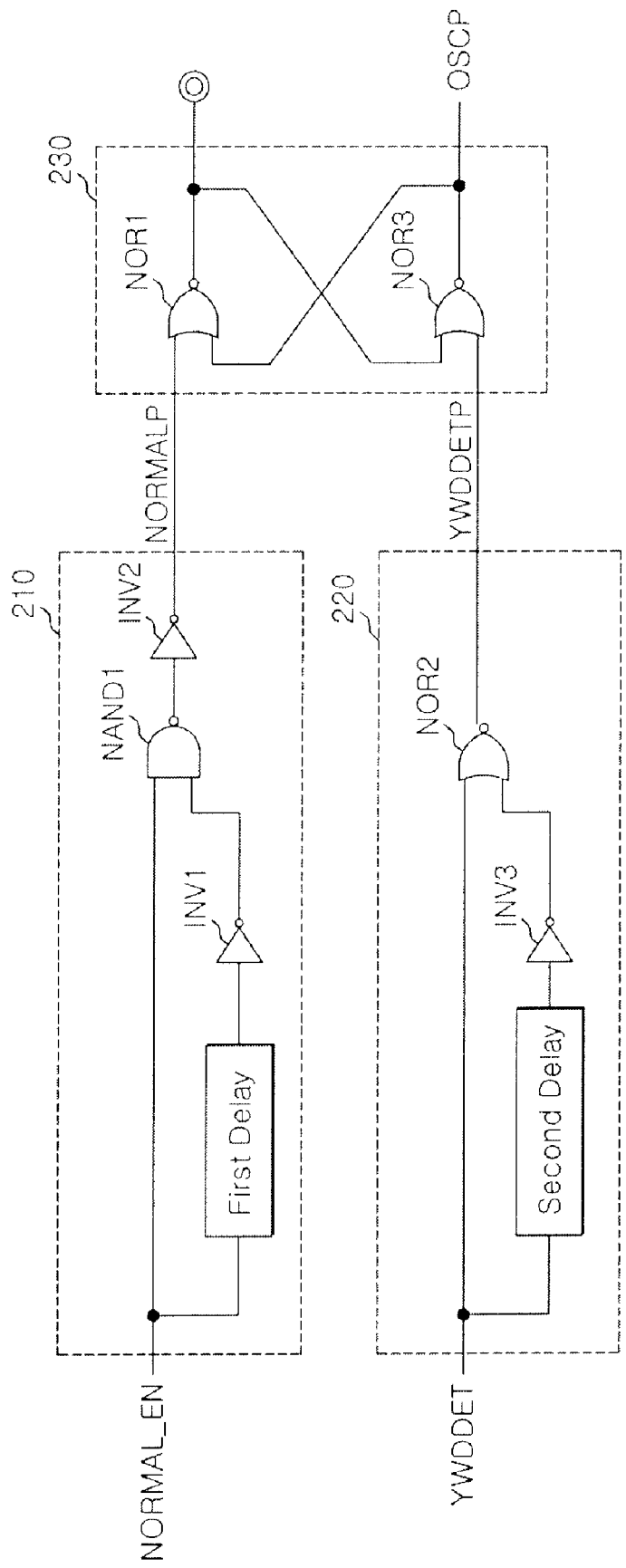
FIG. 3 is a circuit diagram of an operation control signal generation unit of FIG. 1.

FIG. 3 is a circuit diagram of the operation control signal generation unit of FIG. 1.

Referring to FIG. 3, the operation control signal generation unit 20 includes a first pulse output section 210, a second pulse output section 220, and a RS latch section 230.

The first pulse output section 210 is configured to output a first pulse signal NORMALP which pulses at an activation time of the normal operation signal NORMAL_EN. That is, the first pulse signal NORMALP is a signal which is activated during a short period at the activation time of the normal operation signal NORMAL_EN. The second pulse output section 220 is configured to output a second pulse signal YWDDETP which pulses at a deactivation time of the voltage detection signal YWDDET. That is, the second pulse signal YWDDETP is a signal which pulses during a short period at the deactivation time of the voltage detection signal YWDDET. The RS latch section 230 is configured to receive the first pulse signal NORMALP and the second pulse signal YWDDETP and output the operation control signal OSCP. In this embodiment, the RS latch section 230 includes a plurality of NOR gates NOR1 and NOR3.

Figure 4:
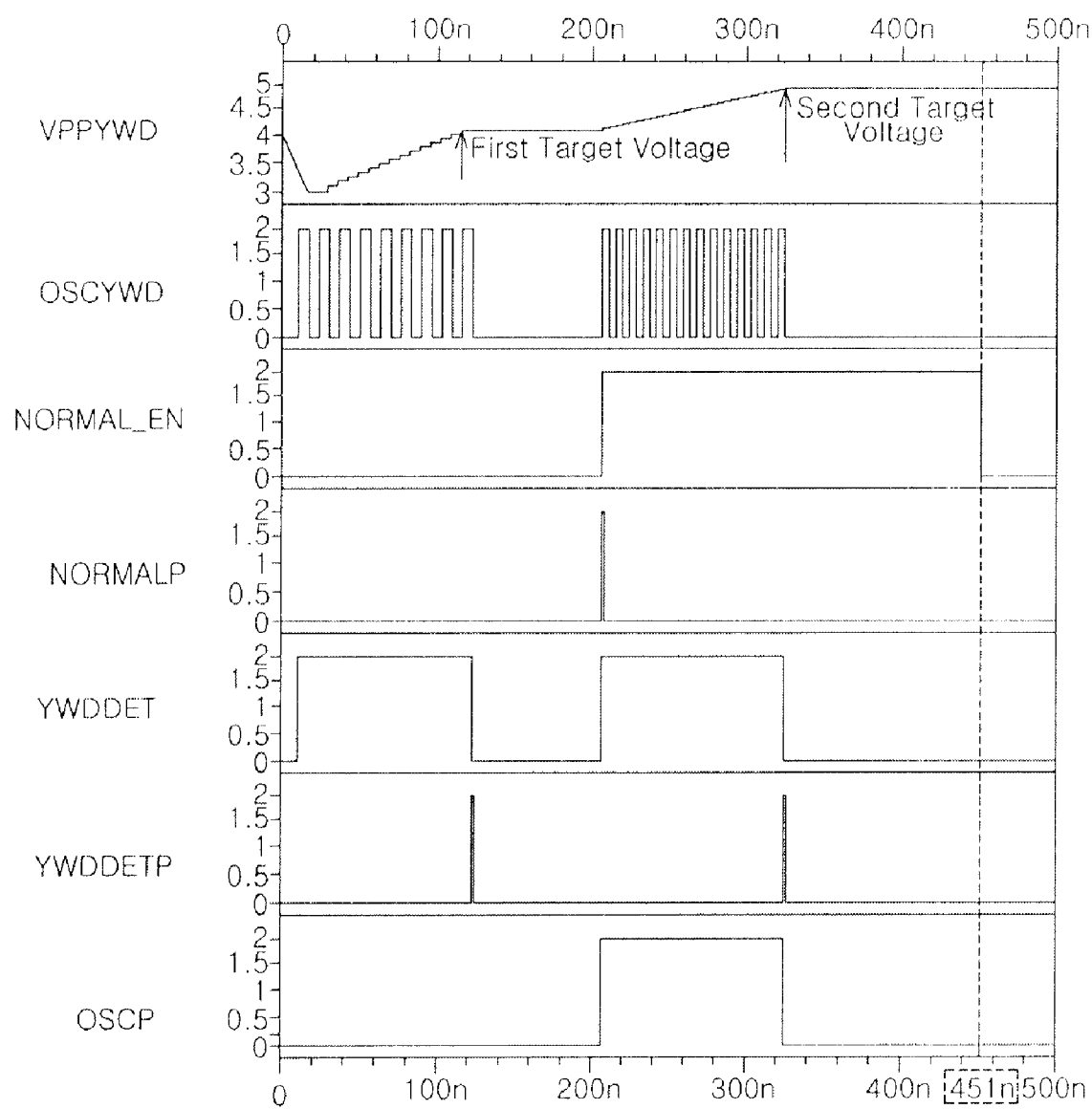
FIG. 4 is a timing diagram showing the internal operation of the semiconductor apparatus of FIG. 1.

FIG. 4 is a timing diagram showing the internal operation of the semiconductor apparatus of FIG. 1.

Referring to FIGS. 1 to 3 as well as FIG. 4, the internal operation of the semiconductor apparatus according to the embodiment will be described as follows.

First, the normal operation signal NORMAL_EN is deactivated to a low level, and the internal voltage VPPYWD maintains a lower level than the first target voltage. Therefore, the periodic pulse signal generation unit 30 outputs a periodic pulse signal OSCYWD which toggles while the voltage detection signal YWDDET is activated at a high level. Accordingly, the charge pumping unit 40 performs a charge pumping operation according to the control of the periodic pulse signal OSCYWD, and increases the voltage level of the internal voltage VPPYWD. When the voltage level of the internal voltage VPPYWD reaches the first target voltage, that is, a stand-by voltage, the voltage detection signal YWDDET is deactivated to a low level. Therefore, the charge pumping operation of the charge pumping unit 40 is stopped, and the voltage level of the internal voltage VPPYWD maintains the first target voltage.

When the normal operation signal NORMAL_EN is activated to a high level, the voltage detection signal YWDDET maintains a high level, until the voltage level of the internal voltage VPPYWD reaches the second target voltage. Furthermore, the operation control signal OSCP maintains a high level, until the voltage level of the internal voltage VPPYWD reaches the second target voltage. At this time, the periodic pulse signal generation unit 30 outputs a periodic pulse signal OSCYWD which toggles during a period in which the operation control signal OSCP is activated to a high level. At this time, the outputted periodic pulse signal OSCYWD has a relatively short toggling period. Therefore, the charge pumping unit 40 performs a charge pumping operation according to the control of the periodic pulse signal OSCYWD, and quickly raises the voltage level of the internal voltage VPPYWD. When the voltage level of the internal voltage VPPYWD reaches the second target voltage, that is, the final target voltage, the voltage detection signal YWDDET and the operation control signal OSCP are deactivated to a low level. Therefore, the charge pumping operation of the charge pumping unit 40 is stopped, and the voltage level of the internal voltage VPPYWD maintains the second target voltage.

Meanwhile, the internal logic unit 50 performs an internal operation by using the internal voltage VPPYWD as a driving voltage, from a time point at which the operation control signal OSCP is deactivated to a low level. That is, when the internal voltage VPPYWD completely rises to the final target voltage, the internal logic unit 50 operates using the internal voltage VPPYWD. Therefore, the operation stability is improved. In short, since the internal logic unit 50 performs the internal operation according to the control of the operation control signal OSCP informing that the internal voltage, that is, the driving voltage of the internal logic unit 50 has reached a stable level, the operation stability is improved. Furthermore, since the voltage formed at the internal voltage terminal in the stand-by mode is lower than in the normal mode, it is possible to reduce unnecessary current consumption. Furthermore, when the mode is switched from the stand-by mode to the normal mode, the voltage level of the internal voltage terminal quickly rises to the final target level. Therefore, it is possible to secure a quick operation characteristic of the internal logic using the internal voltage VPPYWD of the internal voltage terminal as a driving voltage.

So far, embodiments of the present invention have been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. In addition, the configuration of a logic gate may be changed as the occasion demands to realize the same function. That is to say, a NAND unit, a NOR unit, and so forth can be configured through various combinations of NAND gates, NOR gates and inverters. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. An internal voltage generation circuit comprising:
    a voltage detection unit configured to generate a voltage detection signal that indicates whether a voltage level of an internal voltage is a first target voltage level or a second target voltage level higher than the first target voltage level, according to control of a normal operation signal;
    an operation control signal generation unit configured to selectively activate an operation control signal in response to the normal operation signal and the voltage detection signal;
    a periodic pulse signal generation unit configured to generate a periodic pulse signal in response to the operation control signal and the normal operation signal; and
    a charge pumping unit configured to generate the internal voltage by performing a charge pumping operation according to control of the periodic pulse signal.

2. The internal voltage generation circuit according to claim 1, wherein the normal operation signal indicates a normal mode or stand-by mode.

3. The internal voltage generation circuit according to claim 1, wherein the periodic pulse signal generation unit generates the periodic pulse signal having a shorter toggling period when the normal operation signal is activated than when the normal operation signal is deactivated.

4. The internal voltage generation circuit according to claim 1, wherein the voltage detection unit comprises:
    a voltage division section configured to adjust a voltage division ratio according to control of the normal operation signal, divide the voltage level of the internal voltage terminal according to the voltage division ratio, and output a divided voltage; and
    a voltage comparison section configured to compare the divided voltage with a reference voltage in response to a comparison enable signal and the normal operation signal, and output the comparison result as the voltage detection signal.

5. The internal voltage generation circuit according to claim 1, wherein the operation control signal generation unit comprises:
    a first pulse output section configured to output a first pulse signal which pulses at an activation time of the normal operation signal;
    a second pulse output section configured to output a second pulse signal which pulses at a deactivation time of the voltage detection signal; and
    a RS latch section configured to receive the first and second pulse signals and output the operation control signal.

6. A semiconductor apparatus comprising:
    a voltage detection unit configured to generate a voltage detection signal that indicates whether a voltage level of an internal voltage is a first target voltage level or a second target voltage level higher than the first target voltage level, according to control of a normal operation signal;
    an operation control signal generation unit configured to selectively activate an operation control signal in response to the normal operation signal and the voltage detection signal;
    a periodic pulse signal generation unit configured to generate a periodic pulse signal in response to the operation control signal and the normal operation signal;
    a charge pumping unit configured to generate the internal voltage by performing a charge pumping operation according to control of the periodic pulse signal; and
    an internal logic unit configured to perform an internal operation by using the internal voltage transferred through an internal voltage terminal as a driving voltage, in response to the operation control signal.

7. The semiconductor apparatus according to claim 6, wherein the normal operation signal indicates a normal mode or stand-by mode.

8. The semiconductor apparatus according to claim 6, further comprising a normal operation signal generation unit configured to activate the normal operation signal when entering any one of a data programming mode, a data overwrite mode, and a data erasure mode.

9. The semiconductor apparatus according to claim 6, wherein the periodic pulse signal generation unit generates the periodic pulse signal having a shorter toggling period when the normal operation signal is activated than when the normal operation signal is deactivated.

10. The semiconductor apparatus according to claim 6, wherein the voltage detection unit comprises:
    a voltage division section configured to adjust a voltage division ratio according to control of the normal operation signal, divide the voltage level of the internal voltage terminal according to the voltage division ratio, and output a divided voltage; and a voltage comparison section configured to compare the divided voltage with a reference voltage in response to a comparison enable signal and the normal operation signal, and output the comparison result as the voltage detection signal.

11. The semiconductor apparatus according to claim 6, wherein the operation control signal generation unit comprises:

a first pulse output section configured to output a first pulse signal which pulses at an activation time of the normal operation signal;

a second pulse output section configured to output a second pulse signal which pulses at a deactivation time of the voltage detection signal; and a RS latch section configured to receive the first and second pulse signals and output the operation control signal.

12. The semiconductor apparatus according to claim 6, wherein the internal logic unit comprises a data write section configured to drive a programming current pulse by using the internal voltage as a driving voltage, according to control of the operation control signal.

13. The semiconductor apparatus according to claim 6, wherein the internal logic unit comprises a data write section configured to drive a data write current by using the internal voltage as a driving voltage, according to control of the operation control signal.

14. A semiconductor apparatus comprising:

a voltage detection unit configured to detect a voltage level of an internal voltage and output the detection result as a voltage detection signal;

an operation control signal generation unit configured to selectively activate an operation control signal in response to a normal operation signal and the voltage detection signal;

a periodic pulse signal generation unit configured to generate a periodic pulse signal in response to the operation control signal and the normal operation signal;

a charge pumping unit configured to generate the internal voltage by performing a charge pumping operation according to control of the periodic pulse signal; and an internal logic unit configured to perform an internal operation by using the internal voltage transferred through an internal voltage terminal as a driving voltage, in response to the operation control signal.

15. The semiconductor apparatus according to claim 14, wherein the normal operation signal indicates a normal mode or stand-by mode.

16. The semiconductor apparatus according to claim 14, further comprising a normal operation signal generation unit configured to activate the normal operation signal when entering any one of a data programming mode, a data overwrite mode, and a data erasure mode.

17. The semiconductor apparatus according to claim 14, wherein the periodic pulse signal generation unit generates the periodic pulse signal having a shorter toggling period when the normal operation signal is activated than when the normal operation signal is deactivated.

18. The semiconductor apparatus according to claim 14, wherein the voltage detection unit comprises:

a voltage division section configured to adjust a voltage division ratio according to control of the normal operation signal, divide the voltage level of the internal voltage terminal according to the voltage division ratio, and output the divided voltage; and a voltage comparison section configured to compare the divided voltage with a reference voltage in response to a comparison enable signal and the normal operation signal, and output the comparison result as the voltage detection signal.

19. The semiconductor apparatus according to claim 14, wherein the operation control signal generation unit comprises:

a first pulse output section configured to output a first pulse signal which pulses at an activation time of the normal operation signal;

a second pulse output section configured to output a second pulse signal which pulses at a deactivation time of the voltage detection signal; and a RS latch section configured to receive the first and second pulse signals and output the operation control signal.

20. The semiconductor apparatus according to claim 14, wherein the internal logic unit comprises a data write section configured to drive a programming current pulse by using the internal voltage as a driving voltage, according to control of the operation control signal.

21. The semiconductor apparatus according to claim 14, wherein the internal logic unit comprises a data write section configured to drive a data write current by using the internal voltage as a driving voltage, according to control of the operation control signal.

* * * * *